US012518949B2

(12) United States Patent
Choi et al.

(10) Patent No.: US 12,518,949 B2
(45) Date of Patent: Jan. 6, 2026

(54) SUBSTRATE TREATING APPARATUS AND SUBSTRATE TREATING METHOD

(71) Applicant: SEMES CO., LTD., Cheonan-si (KR)

(72) Inventors: Yoon Seok Choi, Suwon-si (KR); Soon-Cheon Cho, Pyeongtaek-si (KR); Yun Sang Kim, Seongnam-si (KR)

(73) Assignee: SEMES CO., LTD., Chungcheongnam-do (KR)

(*) Notice: Subject to any disclaimer, the term of this patent is extended or adjusted under 35 U.S.C. 154(b) by 588 days.

(21) Appl. No.: 17/842,222

(22) Filed: Jun. 16, 2022

(65) Prior Publication Data

US 2022/0406571 A1 Dec. 22, 2022

(30) Foreign Application Priority Data

Jun. 17, 2021 (KR) ........................ 10-2021-0078399

(51) Int. Cl.
*H01J 37/32* (2006.01)
*H05B 6/72* (2006.01)

(52) U.S. Cl.
CPC .. *H01J 37/32422* (2013.01); *H01J 37/32449* (2013.01); *H05B 6/72* (2013.01)

(58) Field of Classification Search
CPC .......... C23C 16/4404; C23C 16/45591; C23C 16/488; H01J 37/32192–32311;
(Continued)

(56) References Cited

U.S. PATENT DOCUMENTS 5,024,748 A * 6/1991 Fujimura .......... H01J 37/32623 156/914
5,279,669 A * 1/1994 Lee ........................ B01J 19/126 118/723 MR
(Continued)

FOREIGN PATENT DOCUMENTS

CN 107466421 A 12/2017
JP S63161622 A 7/1988
(Continued)

OTHER PUBLICATIONS

Korean Office Action dated May 27, 2024 issued in corresponding Korean Appln. No. 10-2021-0078399.
(Continued)

*Primary Examiner* — Benjamin Kendall
(74) *Attorney, Agent, or Firm* — Harness, Dickey & Pierce, P.L.C.

(57) ABSTRACT

Disclosed is a substrate treating apparatus, including: a process chamber in which an inner space for treating a substrate is formed; an ion blocker for dividing the inner space into a plasma generating space and a treatment space; a substrate support unit for supporting a substrate in the treatment space; an exhaust unit for exhausting the treatment space; an anneal source positioned above the ion blocker and transmitting energy for annealing to the substrate through the ion blocker; and a gas supply unit for supplying process gas to the plasma generating space, in which the ion blocker includes: a body which is shaped like a disk, is made of a material through which microwaves are transmittable, and is formed with a plurality of through-holes; and a transparent conductive oxide film provided on at least one of an upper surface and a lower surface of the body in a first thickness or less.

6 Claims, 10 Drawing Sheets

(58) Field of Classification Search

CPC ........... H01J 37/32357; H01J 37/32422; H01J 37/32449; H01J 37/32477; H01J 37/32633; H05B 6/72; H05B 6/725; H05B 6/80

See application file for complete search history.

(56) References Cited

U.S. PATENT DOCUMENTS

| | | | | | |
|---|---|---|---|---|---|
| 5,575,883 | A * | 11/1996 | Nishikawa | H01J 37/32192 | 156/914 |
| 6,132,550 | A * | 10/2000 | Shiomi | H01J 37/3244 | 204/298.31 |
| 2007/0209759 | A1* | 9/2007 | Miya | H01J 37/3244 | 156/345.35 |
| 2008/0216958 | A1* | 9/2008 | Goto | C23C 18/1216 | 156/345.35 |
| 2009/0050056 | A1 | 2/2009 | Ogawa et al. | | |
| 2011/0076401 | A1* | 3/2011 | Chao | C23C 16/4404 | 427/292 |
| 2013/0284093 | A1* | 10/2013 | Jang | H01J 37/32192 | 118/723 ME |
| 2015/0179408 | A1* | 6/2015 | Shimomura | H01J 37/32192 | 438/758 |
| 2015/0196933 | A1* | 7/2015 | Manna | H01L 21/02126 | 427/539 |
| 2018/0122638 | A1 | 5/2018 | Jung et al. | | |

FOREIGN PATENT DOCUMENTS

| | | | |
|---|---|---|---|
| JP | 2010177065 | A | 8/2010 |
| JP | 2014-170787 | A | 9/2014 |
| JP | 2015128108 | A | 7/2015 |
| JP | 2015185594 | A | 10/2015 |
| JP | 2018125373 | A | 8/2018 |
| KR | 10-2001-0002743 | A | 1/2001 |
| KR | 10-2007-0114789 | A | 12/2007 |
| KR | 10-2008-0088419 | A | 10/2008 |
| KR | 20160124534 | A | 10/2016 |
| KR | 10-2021-0024241 | A | 3/2021 |
| WO | WO-2018055730 | A1 | 3/2018 |

OTHER PUBLICATIONS

Japanese Office Action, dated Jul. 4, 2023, issued in corresponding Japanese Patent Application No. 2022-096377.

Korean Office Action dated Feb. 17, 2025 for corresponding Korean Application No. 10-2021-0078399.

Office Action issued in Chinese Patent Application No. 202210693269, dated Nov. 4, 2025.

* cited by examiner

SUBSTRATE TREATING APPARATUS AND SUBSTRATE TREATING METHOD

CROSS-REFERENCE TO RELATED APPLICATIONS

This application claims priority to and the benefit of Korean Patent Application No. 10-2021-0078399 filed in the Korean Intellectual Property Office on Jun. 17, 2021, the entire contents of which are incorporated herein by reference.

TECHNICAL FIELD

The present invention relates to a substrate treating apparatus and a substrate treating method.

BACKGROUND ART

Plasma may be used in a treatment process of the substrate. For example, plasma may be used for etching, deposition, or dry cleaning processes. Plasma is generated by a very high temperature, a strong electric field, or a high-frequency electromagnetic field (RF electromagnetic field), and the plasma refers to an ionized gas state composed of ions, electrons, radicals, etc. Dry cleaning, ashing, or etching processes using plasma are performed when ions or radical particles included in plasma collide with a substrate. Among them, the dry cleaning process is a process for removing a natural oxide film formed on the substrate, and a thin film to be removed is very thin compared to the etching process. Therefore, when the substrate is treated with plasma containing a large amount of radicals, ions, and electrons, not only a natural oxide film to be removed from the substrate but also the underlying film are damaged due to the high etching rate of the thin film. In order to prevent the problem, Korean Patent Application Laid-Open No. 10-2011-0057510 discloses an apparatus for treating a substrate by using plasma mainly containing only radicals excluding electrons and ions by using a grounded ion blocker.

Further, in order to manufacture a semiconductor device, various heat treatments, such as a reforming treatment and an annealing treatment, are repeated with a semiconductor wafer. Further, as semiconductor devices become denser, multilayered, and highly integrated, their specifications are becoming more difficult every year, and improvement of uniformity and film quality within the surface of the semiconductor wafer subjected to various heat treatments is required.

In the manufacturing process of a semiconductor device, an operation of moving between a plasma-using apparatus and an annealing apparatus is involved, and the UPH is affected according to the movement time between the apparatuses.

SUMMARY OF THE INVENTION

The present invention has been made in an effort to provide a substrate treating apparatus capable of efficiently treating a substrate.

The present invention has also been made in an effort to provide a substrate treating apparatus capable of improving an UPH per unit time.

The present invention has also been made in an effort to provide a substrate treating apparatus capable of reducing a footprint of equipment.

The problem to be solved by the present invention is not limited to the above-mentioned problems, and the problems not mentioned will be clearly understood by those skilled in the art from the present specification and the accompanying drawings.

An exemplary embodiment of the present invention provides a substrate treating apparatus, including: a process chamber in which an inner space for treating a substrate is formed; an ion blocker for dividing the inner space into a plasma generating space and a treatment space; a substrate support unit for supporting a substrate in the treatment space; an exhaust unit for exhausting the treatment space; an anneal source positioned above the ion blocker and transmitting energy for annealing to the substrate through the ion blocker; and a gas supply unit for supplying process gas to the plasma generating space, in which the ion blocker includes: a body which is shaped like a disk, is made of a material through which microwaves are transmittable, and is formed with a plurality of through-holes; and a transparent conductive oxide film provided on at least one of an upper surface and a lower surface of the body in a first thickness or less.

In the exemplary embodiment, the transparent conductive oxide film may be formed of any one or a mixture of one or more of AZO, FTO, ATO, $SnO_2$, ZnO, $IrO_2$, $RuO_2$, graphene, metal nanowire, and CNT, or by multiple overlapping thereof.

In the exemplary embodiment, the ion blocker may be grounded.

In the exemplary embodiment, the body may be made of a quartz material.

In the exemplary embodiment, the anneal source may include: an antenna unit including an antenna disposed on one side of the plasma generating space, and a transmission plate positioned between the antenna and the plasma generating space; and a microwave application unit for applying set microwaves to the antenna unit.

In the exemplary embodiment, the anneal source may be a lamp or an optical system for delivering a laser.

In the exemplary embodiment, the substrate treating apparatus may further include: a plasma source for applying energy for exciting the process gas that has been applied to the plasma generating space into plasma to the plasma generating space; and a controller, in which when the substrate is loaded into the treatment space and an atmosphere of the treatment space is changed to a first atmosphere, the controller may perform a first process by exciting the process gas into plasma in the plasma generating space by controlling controls the gas supply unit and the plasma source.

In the exemplary embodiment, the substrate treating apparatus may further include a controller, in which the controller may block supply of the process gas by the gas supply unit in the state where the substrate is continuously supported in the substrate support unit, and apply energy for the annealing to the substrate by controlling the anneal source.

In the exemplary embodiment, the energy for the annealing may be a first microwave.

In the exemplary embodiment, when the transparent conductive oxide film is made of an Indium Tin Oxide (ITO) material, the first thickness may be 1 μm.

Another exemplary embodiment of the present invention provides a substrate treating method, including: a first process of exciting process gas into plasma and treating a substrate with radicals that have passed through an ion blocker that blocks ions in the plasma; and a second process of applying first energy that has transmitted through the ion blocker to the substrate, in which the ion blocker is made of a material through which light, heat, and microwaves are transmittable.

In the exemplary embodiment, the first process and the second process may be performed in one chamber.

In the exemplary embodiment, the ion blocker may be grounded.

In the exemplary embodiment, the ion blocker may include: a body which is shaped like a disk and is made of a material through which light, heat, and microwaves are transmittable; and a transparent conductive oxide film coated on at least one of an upper surface and a lower surface of the body in a first thickness or less.

In the exemplary embodiment, the transparent conductive oxide film may be formed of any one or a mixture of one or more of AZO, FTO, ATO, $SnO_2$, ZnO, $IrO_2$, $RuO_2$, graphene, metal nanowire, and CNT, or by multiple overlapping thereof.

In the exemplary embodiment, when the transparent conductive oxide film is made of an Indium Tin Oxide (ITO) material, the first thickness may be 1 μm.

In the exemplary embodiment, the application of the first energy may be performed in a state where the supply of the process gas is blocked.

In the exemplary embodiment, the first energy may anneal the substrate.

In the exemplary embodiment, the body may be made of a quartz material.

Still another exemplary embodiment of the present invention provides a substrate treating apparatus, including: a process chamber in which an inner space for treating a substrate is formed; an ion blocker which is shaped like a disk, is formed with a plurality of through-holes, is grounded, and divides the inner space into a plasma generating space and a treatment space; a substrate support unit for supporting a substrate in the treatment space; an exhaust unit for exhausting the treatment space; an antenna unit including an antenna plate disposed above the ion blocker and a transmission plate positioned under the antenna plate; an microwave application unit for applying set microwaves to the antenna unit; and a gas supply unit for supplying process gas to the plasma generating space, in which the ion blocker includes: a body made of a quartz material; and the transparent conductive oxide film is formed of any one or a mixture of one or more of AZO, FTO, ATO, $SnO_2$, ZnO, $IrO_2$, $RuO_2$, graphene, metal nanowire, and CNT, or by multiple overlapping thereof.

According to the exemplary embodiment of the present invention, it is possible to efficiently treat the substrate.

According to the exemplary embodiment of the present invention, in manufacturing a semiconductor device on a substrate, it is possible to increase the output per unit time (UPH).

According to the exemplary embodiment of the present invention, it is possible to reduce footprint of equipment. The effect of the present invention is not limited to the foregoing effects, and the not-mentioned effects will be clearly understood by those skilled in the art from the present specification and the accompanying drawings.

DETAILED DESCRIPTION

Figure 1:
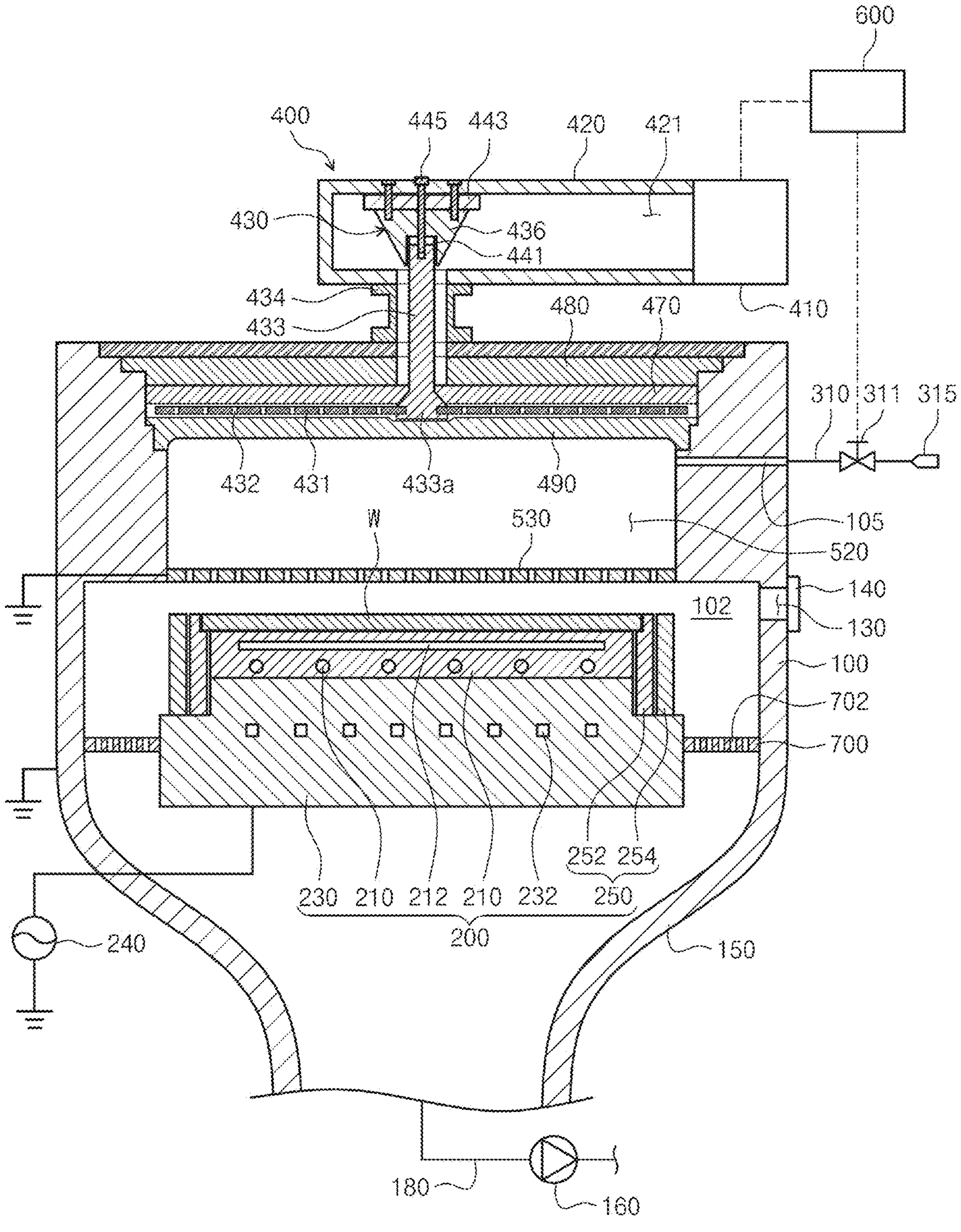
FIG. 1 is a cross-sectional view illustrating a substrate treating apparatus according to an exemplary embodiment (a first exemplary embodiment) of the present invention.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In addition, in describing an exemplary embodiment of the present invention in detail, if it is determined that a detailed description of a related well-known function or configuration may unnecessarily obscure the gist of the present invention, the detailed description thereof will be omitted. In addition, the same reference numerals are used throughout the drawings for parts having similar functions and actions.

In addition, unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

An expression, "and/or" includes each of the mentioned items and all of the combinations including one or more of the items. Further, in the present specification, "connected" means not only when member A and member B are directly connected, but also when member A and member B are indirectly connected by interposing member C between member A and member B.

The exemplary embodiment of the present invention may be modified in various forms, and the scope of the present invention should not be construed as being limited to the following exemplary embodiments. The present exemplary embodiment is provided to more completely explain the present invention to those skilled in the art. Therefore, the shapes of elements in the drawings are exaggerated to emphasize clearer descriptions.

FIG. 1 is a cross-sectional view illustrating a substrate treating apparatus according to an exemplary embodiment of the present invention. This will be described with reference to FIG. 1. A substrate treating apparatus 10 includes a process chamber 100, a substrate support unit 200, a microwave application unit 400, a controller 600, and an exhaust baffle 700.

The process chamber 100 provides a treatment space 102 in which the substrate W is treated. The process chamber 100 is provided in a circular cylindrical shape. The process chamber 100 is provided with a metal material. For example, the process chamber 100 may be made of an aluminum material. An opening 130 is formed in one sidewall of the process chamber 100. The opening 130 is provided as an entrance 130 through which a substrate W can be carried in and out. The entrance 130 may be opened and closed by a door 140. An exhaust port 150 is installed on a bottom surface of the process chamber 100. The exhaust port 150 is positioned to coincide with the central axis of the process chamber 100. The exhaust port 150 serves as a discharge port 150 through which byproducts generated in the treatment space 102 are discharged to the outside of the process chamber 100.

The substrate support unit 200 supports the substrate W in the treatment space. The substrate support unit 200 may be provided as an electrostatic chuck (ESC) for supporting the substrate W by using electrostatic force. Optionally, the substrate support unit 200 may support the substrate W in various ways, such as mechanical clamping.

An example in which the support unit 200 is provided as an electrostatic chuck (ESC) will be described. The support unit 200 includes a dielectric plate 210, a focus ring 252, an edge ring 254, and a lower electrode 230. The substrate W is directly placed on the upper surface of the dielectric plate 210. The dielectric plate 210 is provided in a disk shape. The dielectric plate 210 may have a smaller radius than that of the substrate W. A chucking electrode 212 is installed inside the dielectric plate 210. A power supply (not illustrated) is connected to the chucking electrode 212, and receives a voltage from a power supply (not illustrated). The chucking electrode 212 provides electrostatic force so that the substrate W is adsorbed to the dielectric plate 210 from the applied voltage. A heater 214 for heating the substrate W is installed inside the dielectric plate 210. The heater 214 may be positioned below the chucking electrode 212. The heater 214 may be provided as a spiral-shaped coil. For example, the dielectric plate 210 may be made of a ceramic material.

The lower electrode 230 supports the dielectric plate 210. The lower electrode 230 is positioned under the dielectric plate 210 and is fixedly coupled to the dielectric plate 210. The upper surface of the lower electrode 230 has a stepped shape such that the central region thereof is higher than the edge region. The lower electrode 230 has an area in which the central region of the upper surface corresponds to the lower surface of the dielectric plate 210. A cooling passage 232 is formed in the lower electrode 230. The cooling passage 232 is provided as a passage through which a cooling fluid circulates. The cooling passage 232 may be provided in a spiral shape inside the lower electrode 230. The lower electrode 230 may be connected to an external high-frequency power supply or may be grounded. The high-frequency power supply may apply power to the lower electrode 230 and control ion energy incident on the substrate. The lower electrode 230 may be made of a metal material.

A focus ring 252 concentrates the plasma to the substrate W. The focus ring 252 is provided in an annular ring shape surrounding the dielectric plate 210. The focus ring 252 is positioned at an edge region of the dielectric plate 210. For example, the focus ring 250 may be made of a conductive material. The upper surface of the focus ring 252 may be provided to be stepped. The inner portion of the upper surface of the focus ring 252 is provided to have the same height as the upper surface of the dielectric plate 210 to support the edge region of the bottom surface of the substrate W.

The edge ring 254 is provided in an annular ring shape surrounding the focus ring 252. The edge ring 254 is positioned adjacent to the focus ring 252 in the edge region of the lower electrode 230. The upper surface of the edge ring 254 is provided with a higher height than the upper surface of the focus ring 252. The edge ring 254 may be provided with an insulating material.

The microwave application unit 400 is provided as an example of a plasma source that applies microwaves to a reaction space 101 of the process chamber 100 to excite gas in the reaction space 101 into plasma. The microwave application unit 400 may generate plasma by exciting the process gas.

The microwave application unit 400 includes a microwave power supply 410, a waveguide 420, a microwave antenna 430, a dielectric plate 470, a cooling plate 480, and a transmission plate 490.

The microwave power supply 410 generates microwaves. The waveguide 420 is connected to the microwave power supply 410, and provides a path through which the microwave generated in the microwave power supply 410 is transferred.

The microwave antenna 430 is positioned inside the front end of the waveguide 420. The microwave antenna 430 applies the microwave transferred through the waveguide 420 into the process chamber 100. For example, the microwave antenna 430 may receive power applied by the microwave power supply 410 and apply the power to the reaction space 101. In one example, the microwave may be a microwave of predetermined power with a frequency of 2.45 GHz. The power applied to the microwave power source 410 may be several to several tens of kW.

The microwave antenna 430 includes an antenna plate 431, an antenna rod 433, an external conductor 434, a microwave adapter 436, a connector 441, a cooling plate 443, and an antenna height adjusting unit 445.

The antenna plate 431 is provided as a thin disk, and a plurality of slot holes 432 are formed. The slot holes 432 provide passages through which the microwaves pass. The slot holes 432 may be provided in various shapes. The slot holes 432 may be provided in the shape of 'X', '+', '−', or the like. The slot holes 432 may be combined with each other and arranged in a plurality of ring shapes. The rings have the same center, and different radii.

The antenna rod 433 is provided as a cylindrical rod. The antenna rod 433 is disposed so that the longitudinal direction is the vertical direction. The antenna rod 433 is positioned above the antenna plate 431, and a lower end thereof is inserted and fixed to the center of the antenna plate 431. The antenna rod 433 propagates the microwaves to the antenna plate 431.

The external conductor 434 is located below the front end of the waveguide 420. A space connected with the inner space of the waveguide 420 is formed in the vertical direction inside the external conductor 434. A partial region of the antenna rod 433 is positioned inside the external conductor 434.

A microwave adaptor 436 is located inside the front end of the wave guide 420. The microwave adaptor 436 has a cone shape in which an upper end has a larger radius than that of the lower end. An accommodating space with an open bottom surface is formed at the lower end of the microwave adapter 436.

The connector 441 is positioned in the accommodating space. The connector 441 is provided in a ring shape. The outer surface of the connector 441 has a radius corresponding to the inner surface of the accommodating space. The outer surface of the connector 441 is in contact with the inner surface of the accommodating space and is fixedly positioned. The connector 441 may be made of a conductive material. The upper end of the antenna rod 433 is located in the receiving space and is fitted into the inner region of the connector 441. The upper end of the antenna rod 433 is forcibly inserted into the connector 441, and is electrically connected to the microwave adapter 436 through the connector 441.

The cooling plate 443 is coupled to the upper end of the microwave adapter 436. The cooling plate 443 may be provided as a plate having a larger radius than that of the upper end of the microwave adapter 436. The cooling plate 443 may be made of a material having superior thermal conductivity than that of the microwave adapter 436. The cooling plate 443 may be formed of a copper (Cu) or aluminum (Al) material. The cooling plate 443 promotes cooling of the microwave adapter 436 to prevent thermal deformation of the microwave adapter 436.

The antenna height adjusting unit 445 connects the microwave adaptor 436 and the antenna rod 433. Then, the antenna height adjusting unit 445 moves the antenna rod 433 so that the relative height of the antenna plate 431 with respect to the microwave adapter 436 is changed. The antenna height adjusting unit 445 includes a bolt. The bolt 445 is inserted into the microwave adapter 436 in the vertical direction from the top to the bottom of the microwave adapter 436, and the lower end is located in the accommodating space. The bolt 445 is inserted into the center region of the microwave adaptor 436. The lower end of the bolt 445 is inserted into the upper end of the antenna rod 433. In the upper end of the antenna rod 433, a screw groove into which the lower end of the bolt 445 is inserted and fastened is formed in a predetermined length. The antenna rod 433 moves in the vertical direction according to the rotation of the bolt 445. For example, when the bolt 445 rotates in a clockwise direction, the antenna rod 433 may move up, and when the bolt 445 rotates in a counterclockwise direction, the antenna rod 433 may move down. With the movement of the antenna rod 433, the antenna plate 431 may be moved in the vertical direction.

The dielectric plate 470 is positioned on the antenna plate 431. The dielectric plate 470 is provided with a dielectric material, such as alumina or quartz. The microwaves propagated in the vertical direction from the microwave antenna 430 are propagated in the radial direction of the dielectric plate 470. The microwave propagated to the dielectric plate 470 has a compressed wavelength and is resonant. The resonant microwave is transmitted through the slot holes 432 of the antenna plate 431.

The cooling plate 480 is provided on the dielectric plate 470. The cooling plate 480 cools the dielectric plate 470. The cooling plate 480 may be made of an aluminum material. The cooling plate 480 may cool the dielectric plate 470 by making the cooling fluid flow through a cooling passage (not illustrated) formed therein. The cooling method includes a water cooling type and an air cooling type.

The transmission plate 490 is provided under the antenna plate 431. The transmission plate 490 is provided with a dielectric material, such as alumina or quartz. Microwaves passing through the slot holes 432 of the antenna plate 431 are radiated into the process chamber 100 through the transmission plate 490. By the electric field of the radiated microwaves, the process gas supplied into the process chamber 100 is excited into a plasma state. The upper surface of the transmission plate 490 may be spaced apart from the bottom surface of the antenna plate 431 by a predetermined interval.

The antenna height adjusting unit 445 may vertically move the antenna rod 433 so that the relative height of the antenna plate 431 with respect to the microwave adapter 436 is changed. The antenna height adjusting unit 445 may move the antenna rod 433 in the vertical direction to maintain an appropriate interval between the antenna plate 431 and the transmission plate 490.

A plasma generating space 520 is formed between the transmission plate 490 and the ion blocker 530. The plasma generating space 520 is connected to the gas supply unit 300 that supplies the process gas.

The gas supply unit 300 includes a gas supply pipe 310 and a valve member 311. The process gas supplied by the gas supply unit may be provided as single component gas or mixed gas of two or more components.

The process gas introduced into the plasma generating space 520 is converted to a plasma state by the microwaves. The process gas is decomposed into ions, electrons, and radicals in the plasma state. The plasma passes through the ion blocker 530 and moves into the treatment space 102.

Figure 4:
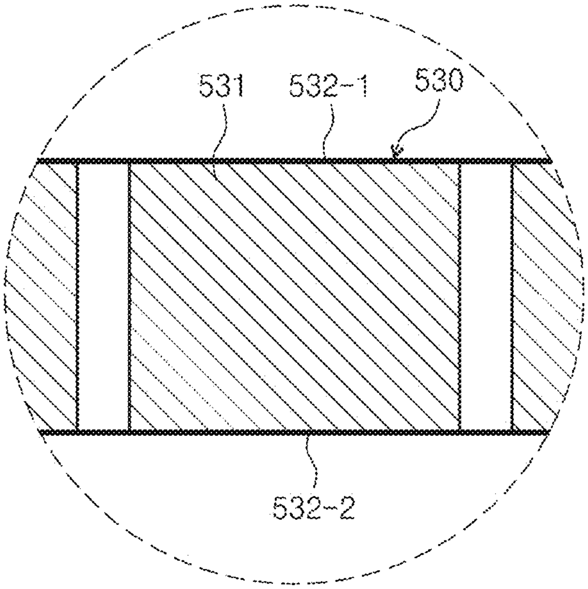
FIG. 4 is an enlarged view of a portion of the ion blocker 530 according to the exemplary embodiment of the present invention.

The ion blocker 530 is provided by coating a Transparent Conductive Oxide (TCO) film on a body 531. The TCO film 532 is provided with a first thickness or less. The first thickness is a thickness through which microwaves can transmit through the determined material. The first thickness is different depending on the material determined as the TCO film 532. "can transmit" in the present description means that the transmission is not significantly affected. For example, when the TCO film 532 is provided with ITO, the first thickness may be 1 μm. The ion blocker 530 is provided in a plate shape. For example, the ion blocker 530 may have a flat plate shape. FIG. 4 is an enlarged view of a portion of the ion blocker 530 according to the exemplary embodiment of the present invention. This will be described in more detail with reference to FIG. 4. The body 531 of the ion blocker 530 is provided with a microwave-transmittable material. Quartz may be provided as an example of the body 531. The TCO film 532 may be provided by being coated on the upper surface of the body 531. The TCO film 532 may be provided by being coated on the lower surface of the body 531. The TCO film 532 may be provided by being coated on the upper and lower surfaces of the body 531. The TCO film 532 is provided with a thickness through which microwaves for heating the substrate W are transmittable. In one example, the TCO film 532 may be Indium Tin Oxide (ITO). In addition, TCO may be formed of any one or more mixtures of AZO, FTO, ATO, $SnO_2$, ZnO, $IrO_2$, $RuO_2$, graphene, metal nanowire, and CNT, or by multiple overlapping. The ion blocker 530 is provided to be grounded. The ion blocker 530 blocks ions from passing through the ion blocker 530 and allows radicals to pass therethrough. In addition, the TCO of the ion blocker 530 is provided with a thickness through which the microwaves are transmitted. The microwave applied by the microwave application unit 400 may pass through the ion blocker 530.

A plurality of through-holes is formed in the ion blocker 530. The through-holes are formed in the vertical direction of the ion blocker 530. The bottom surface of the ion blocker 530 is exposed to the treatment space. The ion blocker 530 is provided between the plasma generating space 520 and the treatment space 102, and forms a boundary between the plasma generating space 520 and the treatment space 102. Radicals of plasma generated in the plasma generating space 520 pass through the through-hole of the ion blocker 530, and ions and electrons are blocked without moving to the treatment space 102 by the ion blocker 530. The ion blocker 530 is positioned above the substrate support unit 200. The ion blocker 530 is positioned to face the dielectric plate 210. The plasma passing through the ion blocker 530 is uniformly supplied to the treatment space 102 in the process chamber 100.

The exhaust baffle 700 uniformly exhausts plasma for each region in the treatment space. The exhaust baffle 700 is positioned between the inner wall of the process chamber 100 and the substrate support unit 200 in the treatment space 102. The exhaust baffle 700 is provided in an annular ring shape. A plurality of through-holes 702 is formed in the exhaust baffle 700. The through-holes 702 are provided to face up and down. The through-holes 702 are arranged along the circumferential direction of the exhaust baffle 700. The through-holes 702 have a slit shape, and have a longitudinal direction toward the radial direction of the exhaust baffle 700.

The controller 600 may control the substrate treating apparatus. The controller 600 may control at least one of the pressure reducing member 123, the substrate support unit 200, the gas supply unit 300, and the microwave application unit 400 of the substrate treating apparatus so that the substrate treating apparatus is capable of performing a substrate treating method which is to be described below. Further, the controller 600 may include a process controller formed of a microprocessor (computer) executing the control of the substrate treating apparatus, a user interface formed of a keyboard through which an operator performs a command input manipulation and the like for managing the substrate treating apparatus, a display for visualizing and displaying an operation situation of the substrate treating apparatus, or the like, and a storage unit in which a control program for executing the processing executed in the substrate treating apparatus under the control of the process controller or various data and a program, that is, a processing recipe, for executing processing on each configuration according to processing conditions are stored. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

Figure 2:
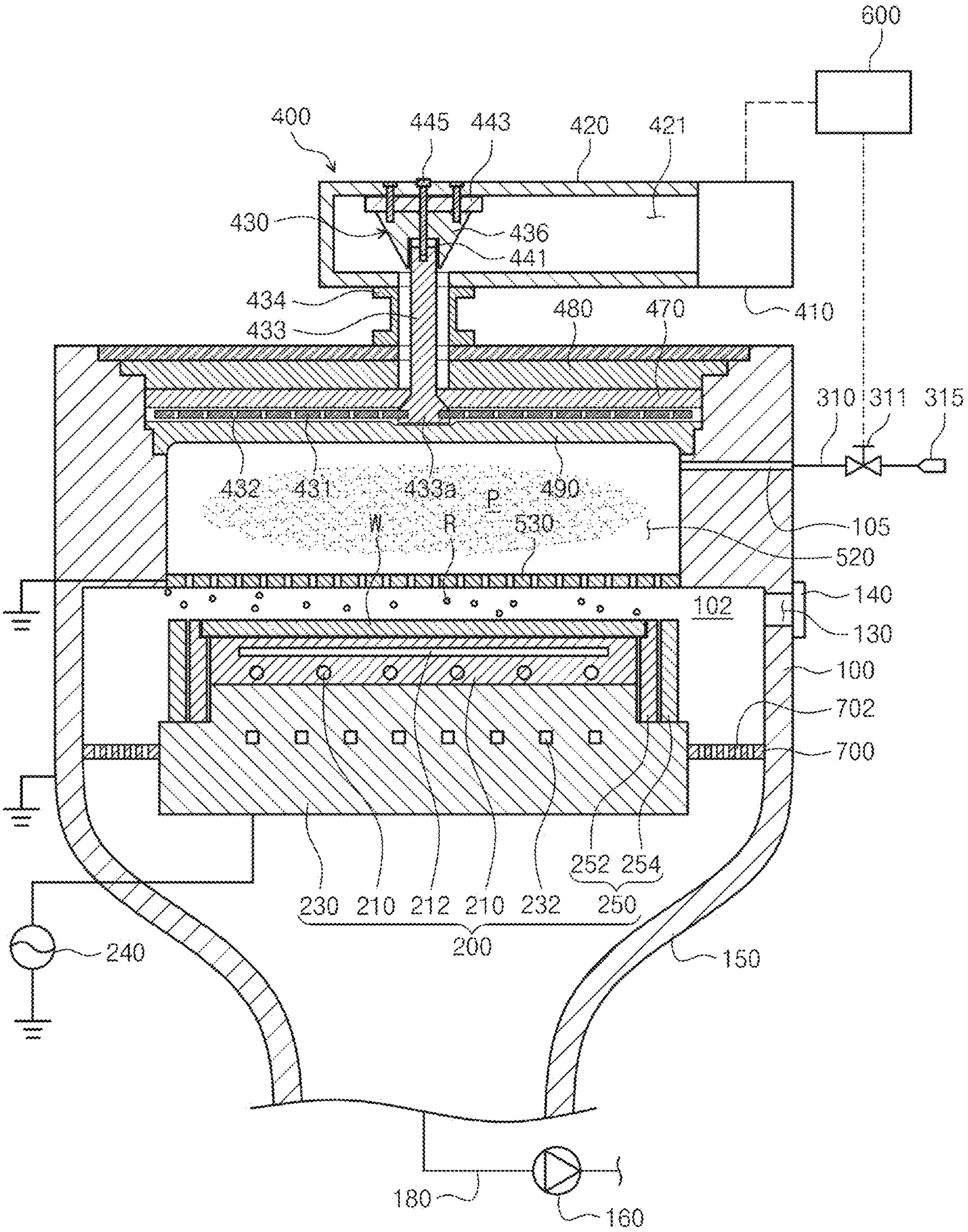
FIG. 2 is a cross-sectional view illustrating an operation when the substrate treating apparatus according to the exemplary embodiment (the first exemplary embodiment) of the present invention performs a plasma treatment.

FIG. 2 is a cross-sectional view illustrating an operation when the substrate treating apparatus according to the exemplary embodiment of the present invention performs a plasma treatment that is a first process. This will be described with reference to FIG. 2. After the substrate W is loaded into the treatment space 102 and placed on the support unit 200, the door 140 is closed. When the atmosphere in the treatment space 102 is formed into a desired atmosphere, the process gas is supplied to the plasma generating space 520 by controlling the valve member 311 of the gas supply unit 300 to an open state. Also, microwaves are applied to the process gas by controlling the microwave power supply 410 to be turned on, and the process gas is excited into plasma. Radicals R of the plasma are introduced into the treatment space 102 through the through-hole of the ion blocker 530. Ions are blocked by the ion blocker 530 and do not pass through the through-hole. The radical R introduced into the treatment space 102 treats the substrate W.

Figure 3:
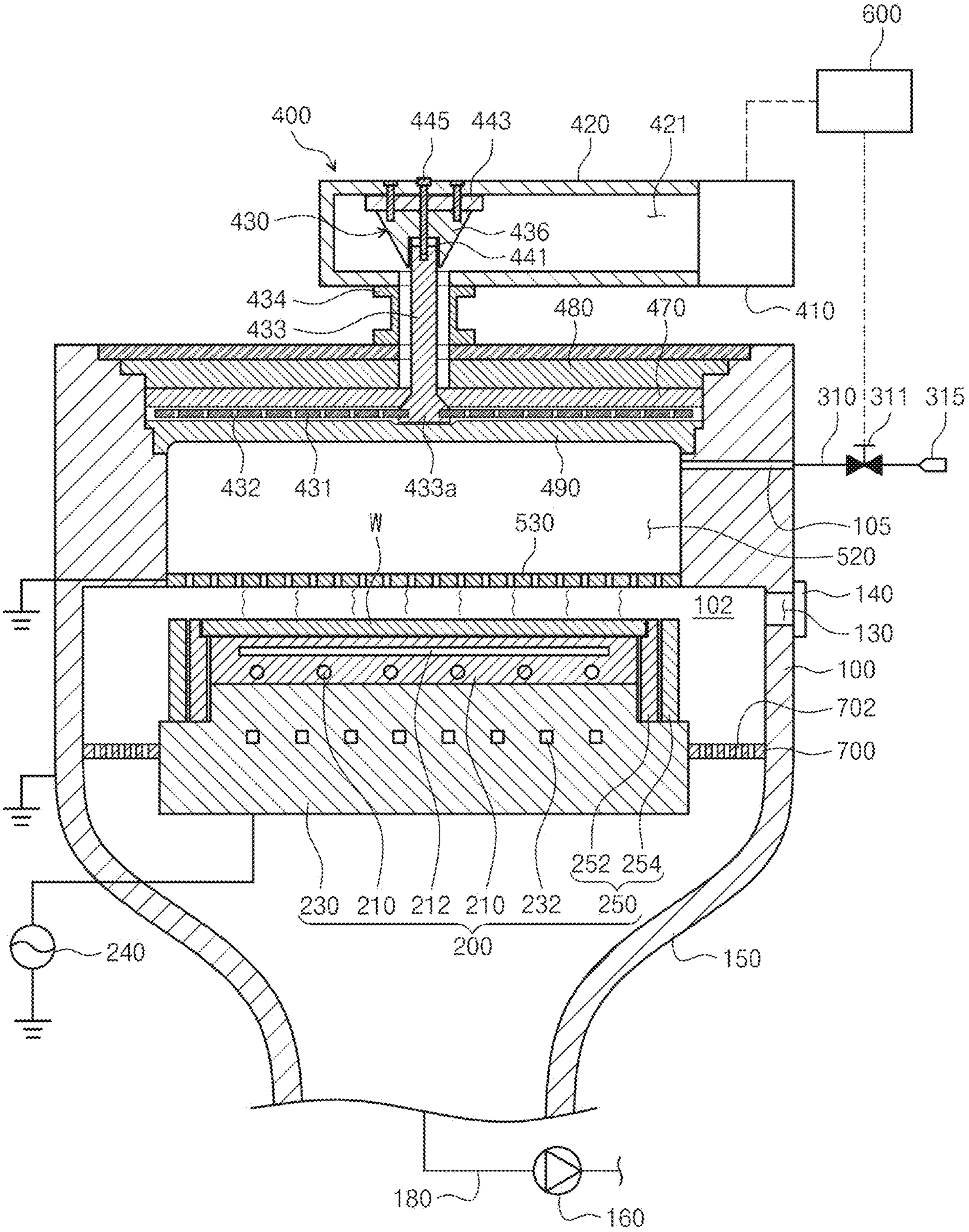
FIG. 3 is a cross-sectional view illustrating an operation when the substrate treating apparatus according to the exemplary embodiment (the first exemplary embodiment) of the present invention performs an annealing treatment.

FIG. 3 is a cross-sectional view illustrating an operation when the substrate treating apparatus according to the exemplary embodiment of the present invention performs an annealing treatment that is a second process. This will be described with reference to FIG. 3. When the atmosphere in the treatment space 102 is formed into a desired atmosphere, the microwave power supply 410 is controlled to be turned on to transmit microwaves for annealing to the substrate W. The microwave is transmitted to the substrate W through the ion blocker 530. The microwaves transmitted to the substrate are microwaves capable of annealing the substrate W. At this time, the valve member 311 of the gas supply unit 300 is controlled to a closed state.

Figure 5:
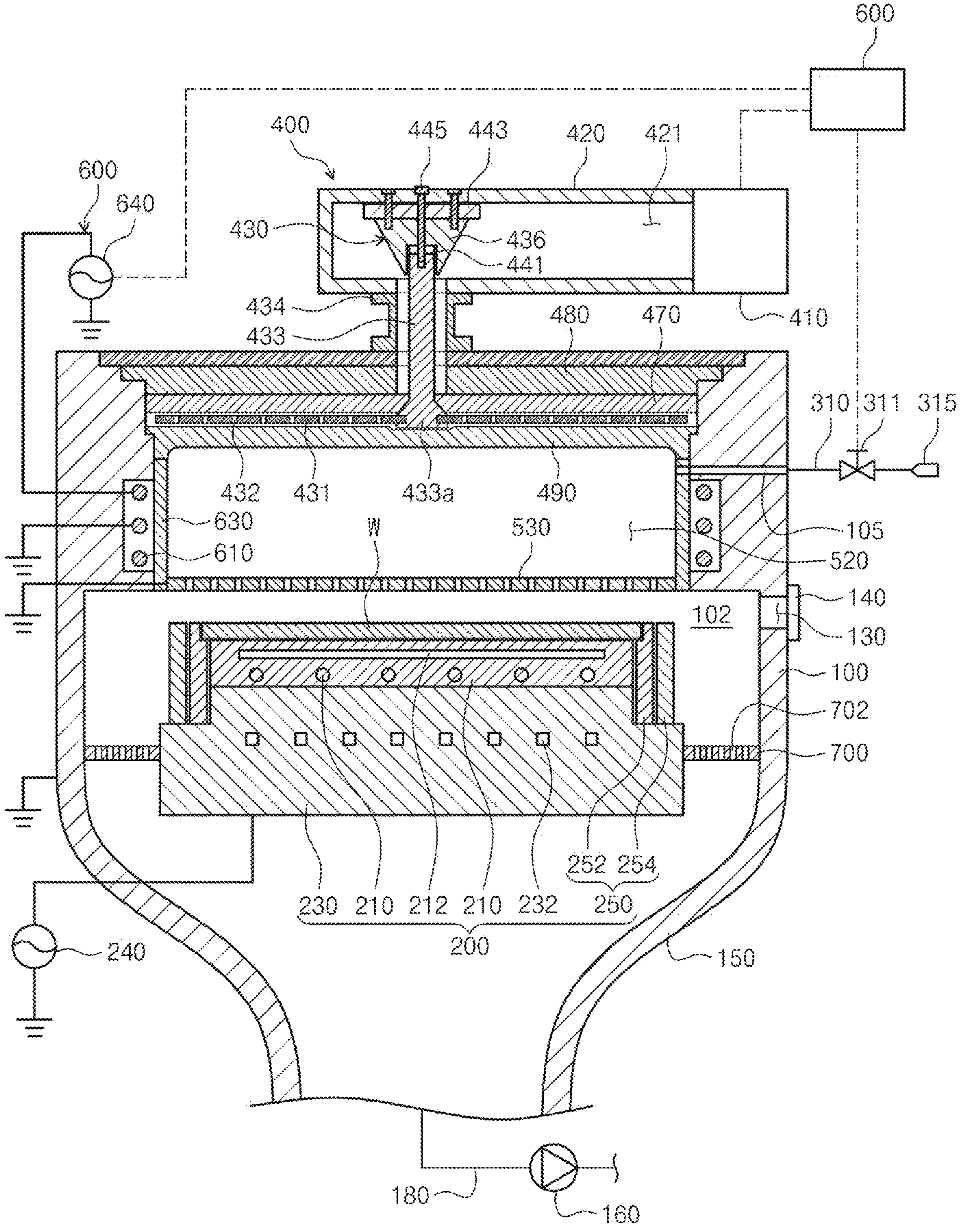
FIG. 5 is a cross-sectional view illustrating a substrate treating apparatus according to an exemplary embodiment (a second exemplary embodiment) of the present invention.

FIG. 5 is a cross-sectional view illustrating a substrate treating apparatus according to an exemplary embodiment (a second exemplary embodiment) of the present invention. This will be described with reference to FIG. 5. In the description of the second exemplary embodiment, the same configuration as that of the first exemplary embodiment is replaced with the description with reference to FIGS. 1 to 3 describing the first exemplary embodiment.

The plasma generating space 520 is defined by a cylindrical quartz chamber 630. An antenna 610 for generating a magnetic field in the plasma generating space 520 is wound around the outside of the plasma generating space 520. As an example of the antenna 610, a cylindrical antenna is provided. The antenna 610 is electrically connected to a power supply 640. When a current from the power supply 640 flows through the antenna 610, an electric field is formed in the plasma generating space 520. The electric field applied from the antenna 610 excites the process gas applied to the plasma generating space 620 into plasma. The antenna 610 and the power supply 640 function as a plasma source.

Figure 6:
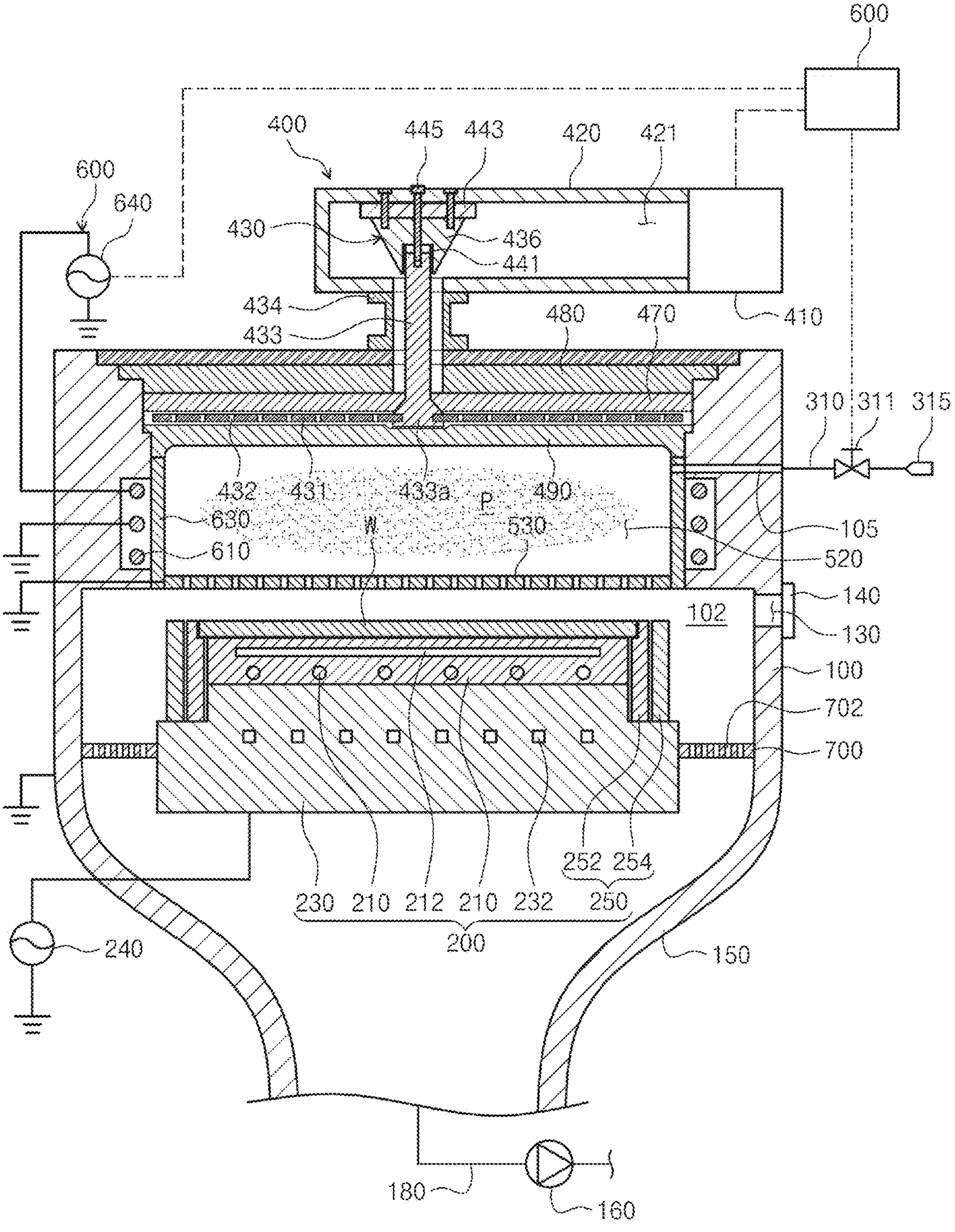
FIG. 6 is a cross-sectional view illustrating an operation when the substrate treating apparatus according to the exemplary embodiment (the second exemplary embodiment) of the present invention performs a plasma treatment.

FIG. 6 is a cross-sectional view illustrating an operation when the substrate treating apparatus according to the exemplary embodiment (the second exemplary embodiment) of the present invention performs a plasma treatment. This will be described with reference to FIG. 6. After the substrate W is loaded into the treatment space 102 and placed on the support unit 200, the door 140 is closed. When the atmosphere in the treatment space 102 is formed in a desired atmosphere, the process gas is supplied to the plasma generating space 520 by controlling the valve member 311 of the gas supply unit 300 to an open state. In addition, a magnetic field is applied to the process gas by controlling the power supply 640 applied to the antenna 610 to be turned on, and the process gas is excited into plasma. Radicals R of the plasma are introduced into the treatment space 102 through the through-hole of the ion blocker 530. Ions are blocked by the ion blocker 530 and do not pass through the through-hole. The radical R introduced into the treatment space 102 treats the substrate W.

Figure 7:
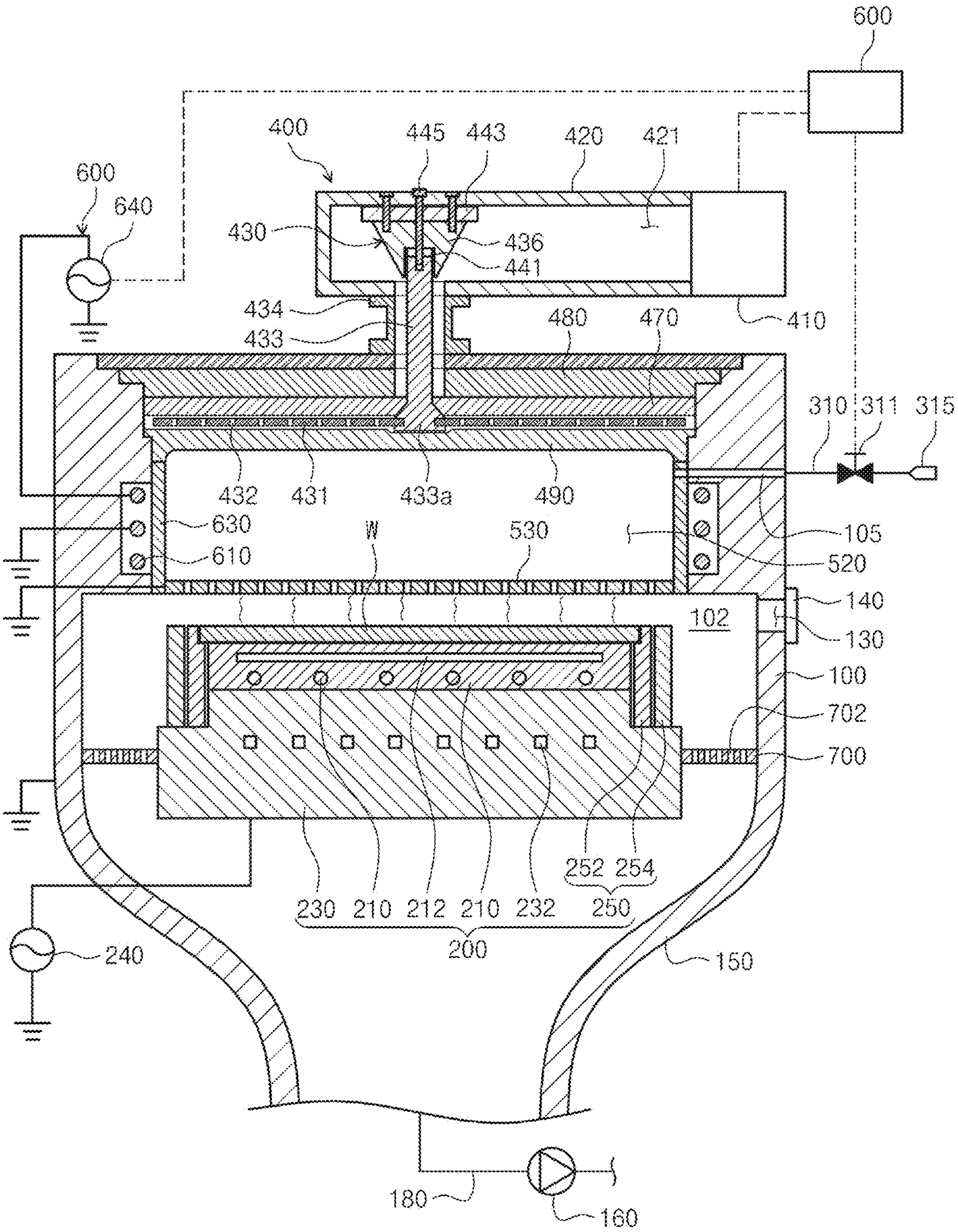
FIG. 7 is a cross-sectional view illustrating an operation when the substrate treating apparatus according to the exemplary embodiment (the second exemplary embodiment) of the present invention performs an annealing treatment.

FIG. 7 is a cross-sectional view illustrating an operation when the substrate treating apparatus according to the exemplary embodiment (the second exemplary embodiment) of the present invention performs an annealing treatment. This will be described with reference to FIG. 7. When the atmosphere in the treatment space 102 is formed into a desired atmosphere, the microwave power supply 410 is controlled to be turned on to transmit microwaves for annealing to the substrate W. The microwave is transmitted to the substrate W through the ion blocker 530. The microwaves transmitted to the substrate are microwaves capable of annealing the substrate W. At this time, the power supply 640 is turned off, and the valve member 311 of the gas supply unit 300 is controlled to a closed state.

Figure 8:
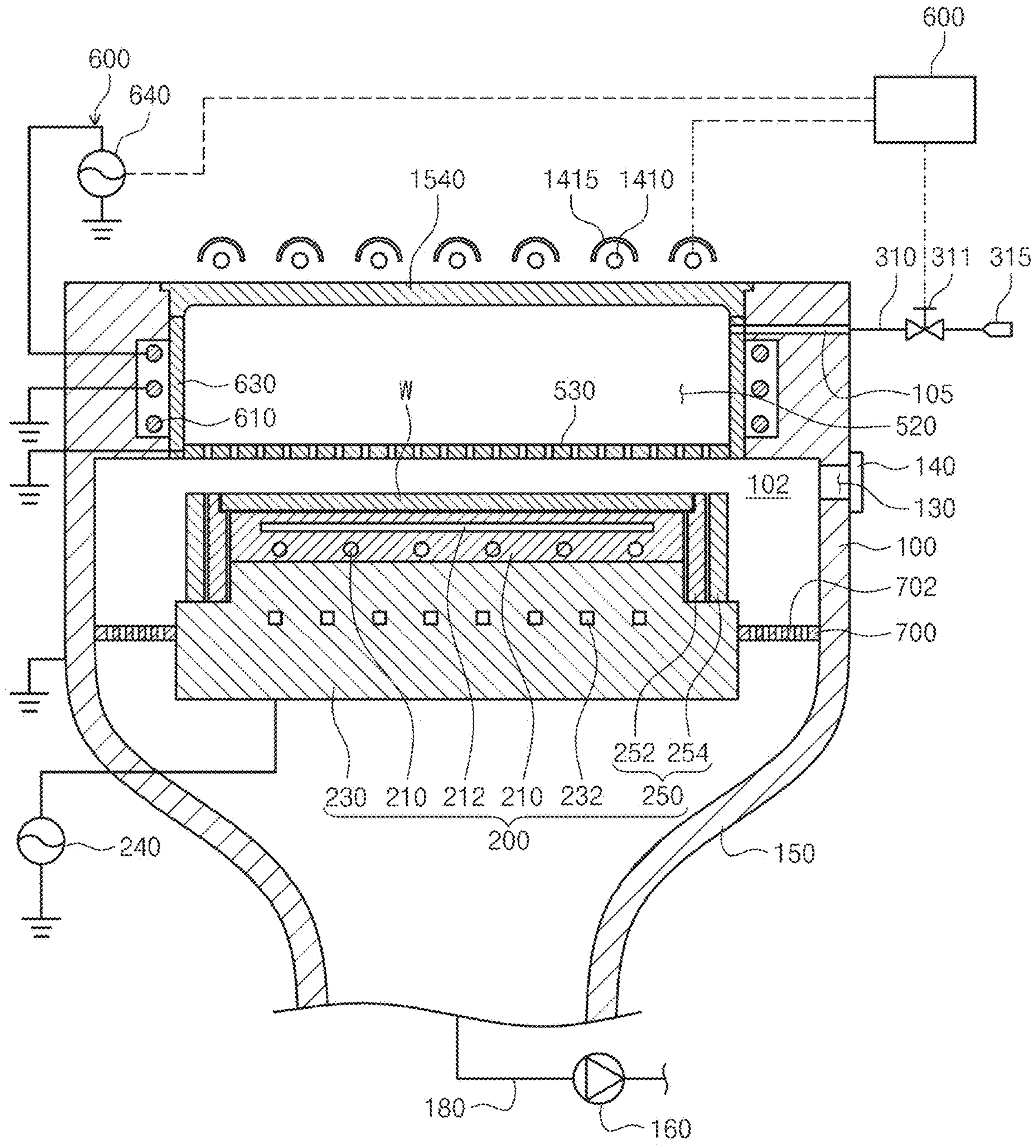
FIG. 8 is a cross-sectional view illustrating a substrate treating apparatus according to an exemplary embodiment (a third exemplary embodiment) of the present invention.

FIG. 8 is a cross-sectional view illustrating a substrate treating apparatus according to an exemplary embodiment (a third exemplary embodiment) of the present invention. This will be described with reference to FIG. 8. In the description of the third exemplary embodiment, the same configuration as that of the second exemplary embodiment is replaced with the description with reference to FIGS. 5 and 6 describing the second exemplary embodiment. A lamp 1410 is provided as a heat source for annealing the substrate W. The lamp 1410 may be a flash lamp. A reflecting plate 1415 for reflecting the light emitted from the lamp 1410 toward the substrate W may be further included.

In the substrate treating method according to the third exemplary embodiment, when the atmosphere in the treatment space 102 is formed into a desired atmosphere, the valve member 311 of the gas supply unit 300 is controlled to an open state to supply process gas to the plasma generating space 520. In addition, a magnetic field is applied to the process gas by controlling the power supply 640 applied to the antenna 610 to be turned on, and the process gas is excited into plasma. Radicals R of the plasma are introduced into the treatment space 102 through the through-hole of the ion blocker 530. Ions are blocked by the ion blocker 530 and do not pass through the through-hole. The radical R introduced into the treatment space 102 treats the substrate W.

When the treatment using radicals for the substrate W is completed, the power supply 640 is turned off, and the valve member 311 of the gas supply unit 300 is controlled to a closed state. When the atmosphere in the treatment space 102 is formed into a desired atmosphere, the lamp 1410 is controlled to be in an on state to transmit optical energy for annealing to the substrate W. The optical energy passes through the ion blocker 530 and is transferred to the substrate W.

Figure 9:
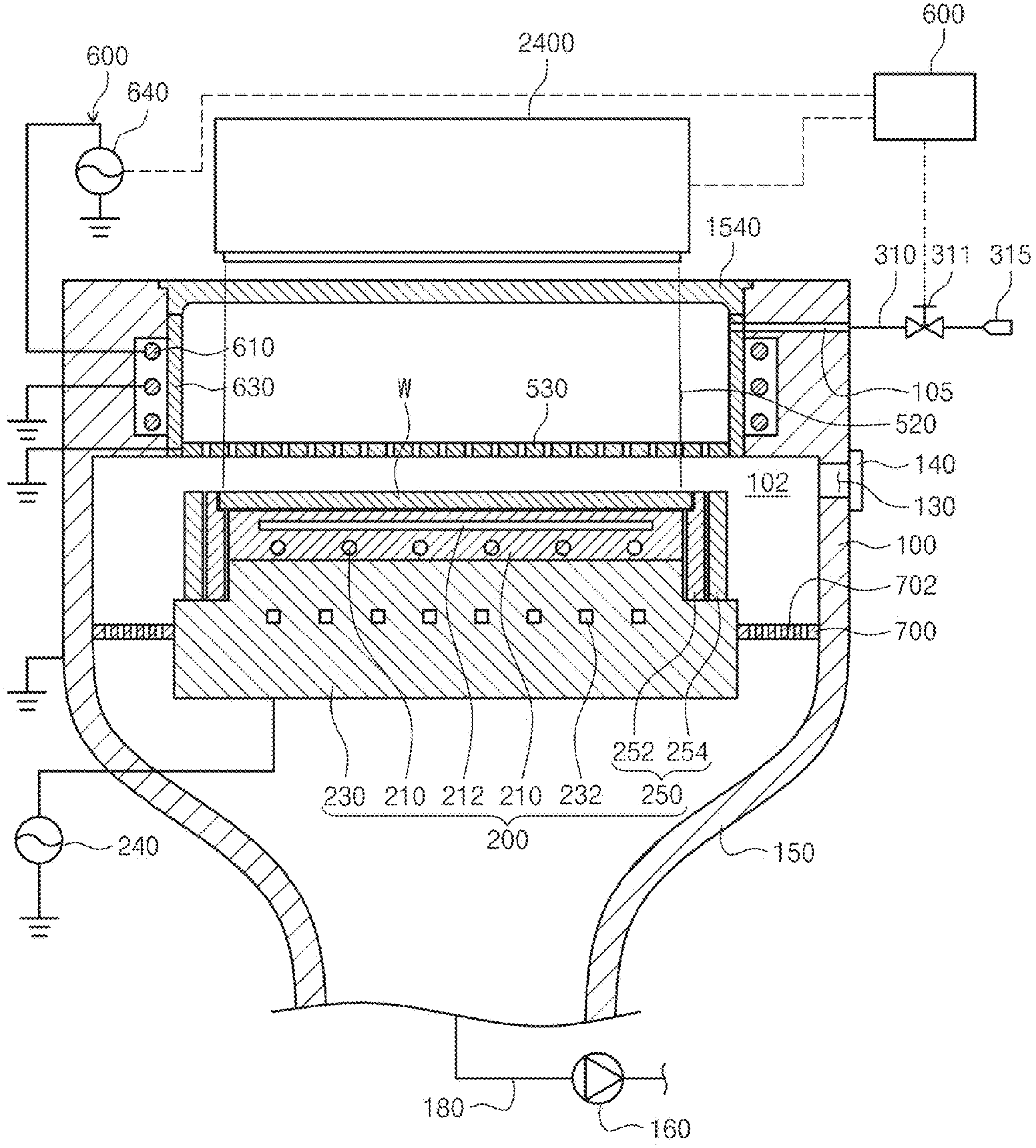
FIG. 9 is a cross-sectional view illustrating a substrate treating apparatus according to an exemplary embodiment (a fourth exemplary embodiment) of the present invention.

FIG. 9 is a cross-sectional view illustrating a substrate treating apparatus according to an exemplary embodiment (a fourth exemplary embodiment) of the present invention. This will be described with reference to FIG. 9. In the description of the fourth exemplary embodiment, the same configuration as that of the third exemplary embodiment is replaced with the description with reference to FIG. 8 describing the third exemplary embodiment. A laser optical system 2400 is provided as a heat source for annealing the substrate W. The laser optical system 2400 includes a laser generating device and an optical module for transferring the laser emitted from the laser generating device to the substrate W. The optical module may be formed of a combination of a plurality of lenses.

In the substrate treating method according to the fourth exemplary embodiment, when the atmosphere in the treatment space 102 is formed into a desired atmosphere, the valve member 311 of the gas supply unit 300 is controlled to an open state to supply process gas to the plasma generating space 520. In addition, a magnetic field is applied to the process gas by controlling the power supply 640 applied to the antenna 610 to be turned on, and the process gas is excited into plasma. Radicals R of the plasma are introduced into the treatment space 102 through the through-hole of the ion blocker 530. Ions are blocked by the ion blocker 530 and do not pass through the through-hole. The radical R introduced into the treatment space 102 treats the substrate W.

When the treatment using radicals for the substrate W is completed, the power supply 640 is turned off, and the valve member 311 of the gas supply unit 300 is controlled to a closed state. When the atmosphere in the treatment space 102 is formed into a desired atmosphere, the laser optical system 2400 is controlled to be turned on to transmit optical energy for annealing to the substrate W. The optical energy passes through the ion blocker 530 and is transferred to the substrate W.

Figure 10:
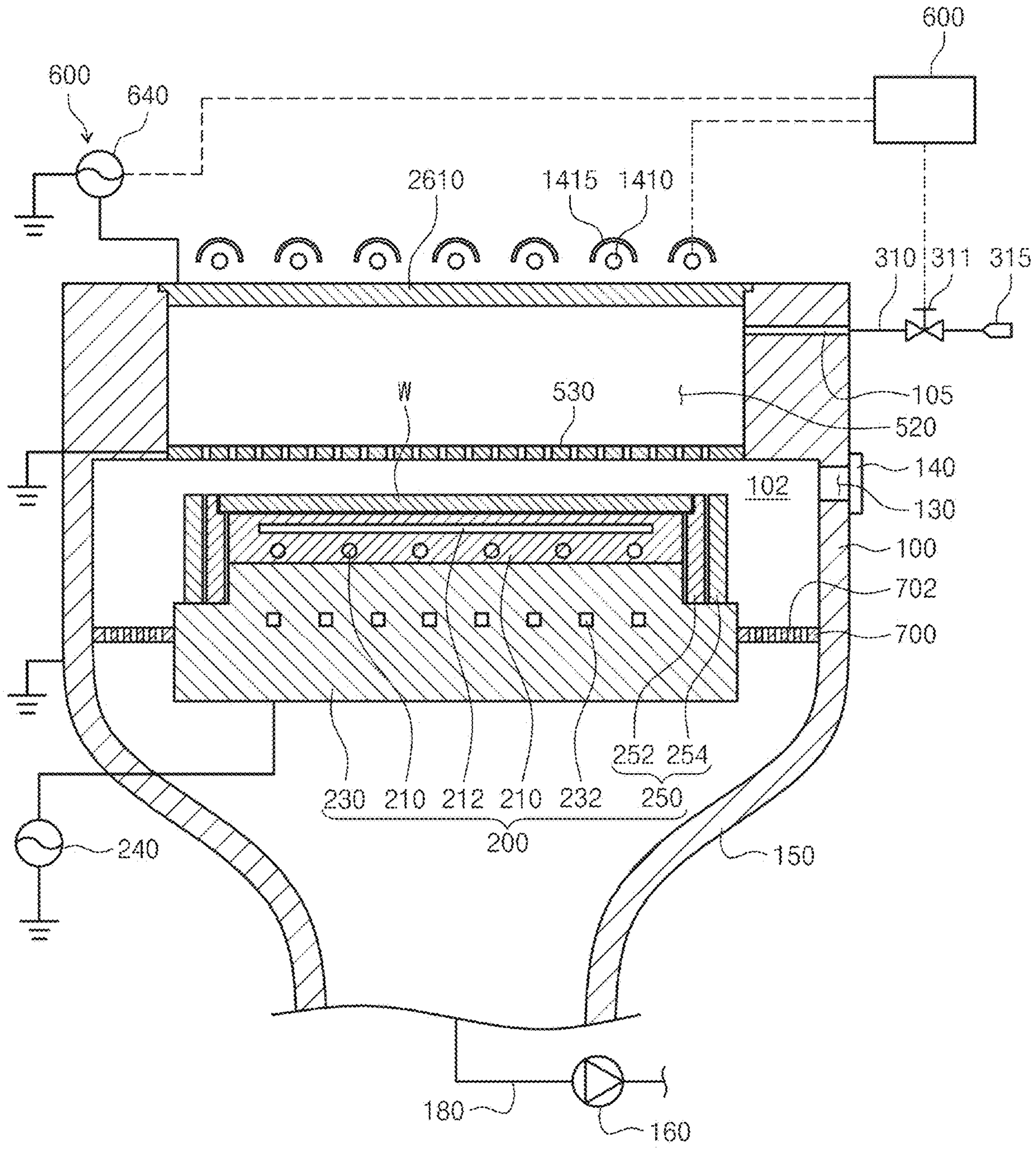
FIG. 10 is a cross-sectional view illustrating a substrate treating apparatus according to an exemplary embodiment (a fifth exemplary embodiment) of the present invention.

FIG. 10 is a cross-sectional view illustrating a substrate treating apparatus according to an exemplary embodiment (a fifth exemplary embodiment) of the present invention. This will be described with reference to FIG. 10. In the description of the fifth exemplary embodiment, the same configuration as that of the third exemplary embodiment is replaced with the description with reference to FIG. 8 describing the third exemplary embodiment. A CCP type is provided as a plasma source for exciting the process gas into plasma. The upper electrode 2610 includes a transparent electrode, and is provided to allow light transmission, heat transmission, and electromagnetic wave transmission. The transparent electrode constituting the upper electrode 2610 is provided under conditions similar to those of the above-described ion blocker. The high-frequency power by the high-frequency power supply 640 is applied to the transparent electrode.

In the substrate treating method according to the fifth exemplary embodiment, when the atmosphere in the treatment space 102 is formed into a desired atmosphere, the valve member 311 of the gas supply unit 300 is controlled to an open state to supply process gas to the plasma generating space 520. In addition, an electric field is applied to the process gas by controlling the power supply 640 applied to the upper electrode 2610 to be turned on, and the process gas is excited into plasma. Radicals R of the plasma are introduced into the treatment space 102 through the through-hole of the ion blocker 530. Ions are blocked by the ion blocker 530 and do not pass through the through-hole. The radical R introduced into the treatment space 102 treats the substrate W.

When the treatment using radicals for the substrate W is completed, the power supply 640 is turned off, and the valve member 311 of the gas supply unit 300 is controlled to a closed state. When the atmosphere in the treatment space 102 is formed into a desired atmosphere, the lamp 1410 is controlled to be in an on state to transmit light energy for annealing to the substrate W. The optical energy passes through the ion blocker 530 and is transferred to the substrate W.

From the configuration according to the exemplary embodiment of the present invention, radical dry cleaning and annealing may be performed in one process chamber 100. The substrate treating apparatus according to the exemplary embodiment of the present invention may be applied to isotropic ALE (t-ALE). According to the substrate treating apparatus according to the exemplary embodiment of the present invention, since it is sufficient if a separate annealing chamber is provided, it is possible to reduce the footprint of the equipment. Further, since the operation of moving between the apparatus using plasma and the annealing apparatus is unnecessary, the movement time between the apparatuses is eliminated, thereby increasing the UPH.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. A substrate treating apparatus, comprising:
a process chamber including an inner space for treating a substrate is formed;
an ion blocker dividing the inner space into a plasma generating space and a treatment space;
a substrate support unit configured to support the substrate in the treatment space;
an exhaust unit configured to exhaust the treatment space;
an anneal source above the ion blocker and configured to transmit energy for annealing to the substrate through the ion blocker;
a plasma source configured to apply energy for exciting a process gas in the plasma generating space into plasma;
a gas supply unit configured to supply the process gas to the plasma generating space; and
a controller,
wherein the ion blocker includes a material through which microwaves are transmittable, and is formed with a plurality of through-holes,
wherein the controller is configured to control the gas supply unit and the plasma source to perform a first process by exciting the process gas into plasma in the plasma generating space in response to the substrate being loaded into the treatment space, and to block supply of the process gas in a plasma state to where the substrate is continuously supported in the substrate support unit, and
applies energy for the annealing to the substrate,
wherein the ion blocker is configured to block ions from passing through the ion blocker and allow radicals to pass through the ion blocker, and
wherein the energy for the annealing to the substrate is a first microwave.

2. The substrate treating apparatus of claim 1,
wherein the ion blocker includes:
a body formed with the plurality of through-holes; and
a transparent conductive oxide film provided on an upper surface and a lower surface of the body in a first thickness or less,
the first thickness is a thickness through which microwaves can be transmitted,
wherein the transparent conductive oxide film includes one or more of Indium Tin Oxide (ITO), AZO, FTO, ATO, $SnO_2$, ZnO, $IrO_2$, $RuO_2$, graphene, metal nanowire, and CNT, or by multiple overlapping thereof.

3. The substrate treating apparatus of claim 2, wherein the body is made of a quartz material.

4. The substrate treating apparatus of claim 2, wherein when the transparent conductive oxide film is made of an Indium Tin Oxide (ITO) material, the first thickness is 1 μm.

5. The substrate treating apparatus of claim 1, wherein the ion blocker is configured to be grounded.

6. The substrate treating apparatus of claim 1, wherein the anneal source includes:
an antenna unit including an antenna disposed on one side of the plasma generating space, and a transmission plate positioned between the antenna and the plasma generating space; and
a microwave application unit configured to apply microwaves to the antenna unit.

* * * * *